US 10,348,266 B2

(12) United States Patent
Teshima et al.

(10) Patent No.: US 10,348,266 B2
(45) Date of Patent: Jul. 9, 2019

(54) IMPEDANCE CONVERSION CIRCUIT, ANTENNA APPARATUS, AND WIRELESS COMMUNICATION APPARATUS

(71) Applicant: Murata Manufacturing Co., Ltd., Nagaokakyo-shi, Kyoto-fu (JP)

(72) Inventors: Yuichiro Teshima, Nagaokakyo (JP); Kenichi Ishizuka, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 407 days.

(21) Appl. No.: 15/057,147

(22) Filed: Mar. 1, 2016

(65) Prior Publication Data
US 2016/0182003 A1 Jun. 23, 2016

Related U.S. Application Data

(63) Continuation of application No. PCT/JP2014/064908, filed on Jun. 5, 2014.

(30) Foreign Application Priority Data

Sep. 5, 2013 (JP) ................... 2013-184176
Oct. 28, 2013 (JP) ................... 2013-223464

(51) Int. Cl.
H03H 7/38 (2006.01)
H01Q 1/50 (2006.01)
(Continued)

(52) U.S. Cl.
CPC .............. *H03H 7/38* (2013.01); *H01Q 1/243* (2013.01); *H01Q 1/50* (2013.01); *H04B 1/0458* (2013.01);
(Continued)

(58) Field of Classification Search
CPC .......... H03H 7/38; H04B 1/0458; H04B 1/18; H04B 1/3827; H01Q 1/243; H01Q 1/50
(Continued)

(56) References Cited

U.S. PATENT DOCUMENTS 5,654,679 A 8/1997 Mavretic et al.
5,889,252 A 3/1999 Williams et al.
(Continued)

FOREIGN PATENT DOCUMENTS

JP 09-307331 A 11/1997
JP 2000-512460 A 9/2000
(Continued)

OTHER PUBLICATIONS

Official Communication issued in International Patent Application No. PCT/JP2014/064908, dated Sep. 9, 2014.

Primary Examiner — Stephen E. Jones
Assistant Examiner — Samuel S Outten
(74) Attorney, Agent, or Firm — Keating & Bennett, LLP

(57) ABSTRACT

An impedance conversion circuit includes an auto-transformer circuit including a first inductor connected between a first port connected on a power supply portion side and a second port connected on an antenna side and a second inductor connected between a third port that is grounded and the second port; a first phase shifter with a first end connected to the first port; an inductor connected in series between a second end of the first phase shifter and the power supply portion; and a capacitor connected in series to the inductor and connected in series between the second end of the first phase shifter and the power supply portion.

18 Claims, 20 Drawing Sheets

(51) Int. Cl.
    *H04B 1/3827*     (2015.01)
    *H04B 1/04*     (2006.01)
    *H04B 1/18*     (2006.01)
    *H01Q 1/24*     (2006.01)
    *H01P 1/203*     (2006.01)

(52) U.S. Cl.
    CPC ............ *H04B 1/18* (2013.01); *H04B 1/3827* (2013.01); *H01P 1/20345* (2013.01)

(58) Field of Classification Search
    USPC .......................................................... 333/32
    See application file for complete search history.

(56) References Cited

U.S. PATENT DOCUMENTS

| | | | |
|---|---|---|---|
| 2008/0055016 A1* | 3/2008 | Morris, III | H03H 7/38 |
| | | | 333/129 |
| 2008/0218290 A1 | 9/2008 | Abadeer et al. | |
| 2012/0300870 A1* | 11/2012 | Dickey | H04L 27/12 |
| | | | 375/295 |
| 2013/0207739 A1* | 8/2013 | Bakalski | H03H 7/40 |
| | | | 333/33 |
| 2014/0078014 A1 | 3/2014 | Kato et al. | |

FOREIGN PATENT DOCUMENTS

| | | |
|---|---|---|
| JP | 2001-507181 A | 5/2001 |
| WO | 2012/147383 A1 | 11/2012 |
| WO | 2012/165149 A1 | 12/2012 |

* cited by examiner freq. (700MHz to 2.30GHz)

freq. (700MHz to 2.30GHz)

freq. (700MHz to 2.30GHz)

freq. (700MHz to 2.30GHz)

freq. (700MHz to 2.30GHz)

freq. (700MHz to 2.30GHz)

freq. (700MHz to 2.30GHz)

freq. (700MHz to 2.30GHz)

freq. (700MHz to 2.30GHz)

freq. (700MHz to 2.30GHz)

freq. (700MHz to 2.30GHz)

freq. (700MHz to 2.30GHz)

freq. (700MHz to 2.30GHz)

freq. (700MHz to 2.30GHz)

freq. (700MHz to 2.30GHz)

IMPEDANCE CONVERSION CIRCUIT, ANTENNA APPARATUS, AND WIRELESS COMMUNICATION APPARATUS

BACKGROUND OF THE INVENTION

1. Field of the Invention

The present invention relates to an impedance conversion circuit applied in an antenna matching circuit or the like, and to an antenna apparatus and a wireless communication apparatus including such an impedance conversion circuit.

2. Description of the Related Art

Extremely wide bands are used as frequency bands in recent cellular phones. For example, if a cellular terminal is pentaband-compliant, there is demand for the terminal to be compliant with both a low band (824 MHz to 960 MHz, for example) and a high band (1710 MHz to 2170 MHz, for example). Accordingly, to enable a single antenna to handle both a low band and a high band, different operating modes are assigned to the antenna depending on the frequency band. The antenna is normally designed to handle a low band in a fundamental wave mode, and handle a high band in a harmonic mode. An input impedance of the antenna differs depending on the mode (resonance point).

Meanwhile, a matching circuit such as that disclosed in Japanese Unexamined Patent Application Publication No. 9-307331, for example, is generally used for an antenna, and chip capacitors, chip inductors, and so on are used for each matching element.

However, in a matching circuit that uses chip capacitors, chip inductors, and the like as disclosed in Japanese Unexamined Patent Application Publication No. 9-307331, it is difficult to achieve matching that is optimal for each of communication systems using different frequencies (and particularly communication systems using mutually distant frequencies). It is furthermore necessary to use chip elements having high element values in the case where the impedance is to be shifted greatly, and there is thus a problem in that communication characteristics will degrade under the influence of loss arising in the chip elements.

SUMMARY OF THE INVENTION

Accordingly, preferred embodiments of the present invention provide an impedance conversion circuit that achieves improved or optimal antenna matching for each of communication systems whose usage frequencies are mutually distant, and provide an antenna apparatus and a wireless communication apparatus including such an impedance conversion circuit.

An impedance conversion circuit according to a preferred embodiment of the present invention includes an auto-transformer circuit including a first inductor connected between a first port connected on a power supply portion side and a second port connected on an antenna side and a second inductor connected between a third port that is grounded and the second port, the first inductor and the second inductor being coupled; a first phase shifter, a first end of which is connected to the first port of the auto-transformer circuit; an inductor connected in series between a second end of the first phase shifter and the power supply portion; and a capacitor connected in series to the inductor and connected in series between the second end of the first phase shifter and the power supply portion.

According to this configuration, the range of impedance trajectories produced by the auto-transformer circuit on a Smith chart is reduced, and a smaller phase rotation amount by the first phase shifter is sufficient.

Meanwhile, it is preferable, when a region in polar coordinates where a real part is positive and an imaginary part is positive of a reflection coefficient (a complex reflection coefficient ρ) defines and serves as a first quadrant, a region in the polar coordinates where the real part is negative and the imaginary part is positive of the reflection coefficient defines and serves as a second quadrant, a region in the polar coordinates where the real part is negative and the imaginary part is negative of the reflection coefficient defines and serves as a third quadrant, and a region in the polar coordinates where the real part is positive and the imaginary part is negative of the reflection coefficient defines and serves as a fourth quadrant, among trajectories of the reflection coefficient when viewing the second port side from the first port obtained by making a frequency sweep, that the auto-transformer circuit shift a center of a first trajectory that is a trajectory in a low band to the first quadrant or the second quadrant and shift a center of a second trajectory that is a trajectory in a high band to the first quadrant or the fourth quadrant; that the first phase shifter rotate the first trajectory so that the center thereof is in the first quadrant and rotate the second trajectory so that the center thereof is in the fourth quadrant; that the capacitor move the center of the first trajectory toward a center of the polar coordinates; and that the inductor move the center of the second trajectory toward the center of the polar coordinates.

According to this configuration, the impedance trajectories produced by the auto-transformer circuit on the Smith chart are able to be matched by an inductor and a capacitor having comparatively low values, after the small phase rotation by the first phase shifter.

It is preferable that the center of the first trajectory be a position in the polar coordinates that takes an average of a maximum value and a minimum value of the real part of the reflection coefficient as the real part and an average of the maximum value and the minimum value of the imaginary part as the imaginary part for the first trajectory, and that the center of the second trajectory be a position in the polar coordinates that takes an average of a maximum value and a minimum value of the real part of the reflection coefficient as the real part and an average of the maximum value and the minimum value of the imaginary part as the imaginary part for the second trajectory.

According to this configuration, when the trajectory in the low band is circular, a representative position of the first trajectory is able to be clearly determined. Likewise, when the trajectory in the high band is circular, a representative position of the second trajectory is able to be clearly determined.

It is preferable that the center of the first trajectory be an intermediate point in the polar coordinates between the reflection coefficient at a lower limit frequency and the reflection coefficient at an upper limit frequency in the low band, and the center of the second trajectory be an intermediate point in the polar coordinates between the reflection coefficient at a lower limit frequency and the reflection coefficient at an upper limit frequency in the high band.

According to this configuration, when the trajectory in the low band does not meet a predetermined circular circumference (is less than ½ the circumference, for example), a representative position of the first trajectory is able to be clearly determined, and when the trajectory in the high band does not meet a predetermined circular circumference, a representative position of the second trajectory is able to be clearly determined.

In addition, it is preferable that the center of the first trajectory be a position corresponding to an average of the reflection coefficients at each of the frequencies located at equal frequency intervals in the trajectory of the low band, and the center of the second trajectory be a position corresponding to an average of the reflection coefficients at each of frequencies located at equal frequency intervals in the trajectory of the high band.

According to this configuration, representative positions of the first trajectory and the second trajectory are able to be more clearly determined.

It is preferable that the shifting of the first trajectory and the shifting of the second trajectory by the auto-transformer circuit be produced by an inductance arising in parallel and an inductance arising in series in an equivalent circuit of the auto-transformer circuit.

According to this configuration, the impedance conversion circuit is able to be configured using a smaller number of elements, by using impedance conversion frequency characteristics of the auto-transformer circuit.

A second phase shifter may be connected between the inductor and the capacitor. As a result, impedance matching is able to be more effectively carried out using the inductor or the capacitor.

It is preferable that the second phase shifter include a transmission line. Accordingly, frequency characteristics of the second phase shifter are able to be lightened.

It is preferable that the first phase shifter include a transmission line. Accordingly, frequency characteristics of the first phase shifter are able to be lightened.

An antenna apparatus according to a preferred embodiment of the present invention includes an impedance conversion circuit according to one of the preferred embodiments of the present invention described above, and an antenna connected to the second port of the auto-transformer circuit of the impedance conversion circuit. According to this configuration, a small-size, high-gain antenna apparatus capable of impedance matching across a wide band is obtained.

A wireless communication apparatus according to a preferred embodiment of the present invention includes an impedance conversion circuit according to one of the preferred embodiments of the present invention described above, an antenna connected to the second port of the auto-transformer circuit of the impedance conversion circuit, and a communication circuit that is the power supply portion. According to this configuration, a multiband wireless communication apparatus having a miniaturized antenna portion is obtained.

According to various preferred embodiments of the present invention, the auto-transformer circuit reduces the range of an impedance trajectory on a Smith chart, and a smaller phase rotation amount by the first phase shifter is sufficient, which enables the apparatus to be miniaturized. In addition, low element values are sufficient for the added reactance elements, which achieves a lower amount of loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Before describing a first preferred embodiment of the present invention, an impedance matching circuit that achieves impedance matching using a transmission line and a reactance element will be described as a comparative example. FIGS. 16A, 16B, 17A, 17B, 18A, 18B, 19A, and 19B are all diagrams illustrating the comparative example.

Figure 14A:
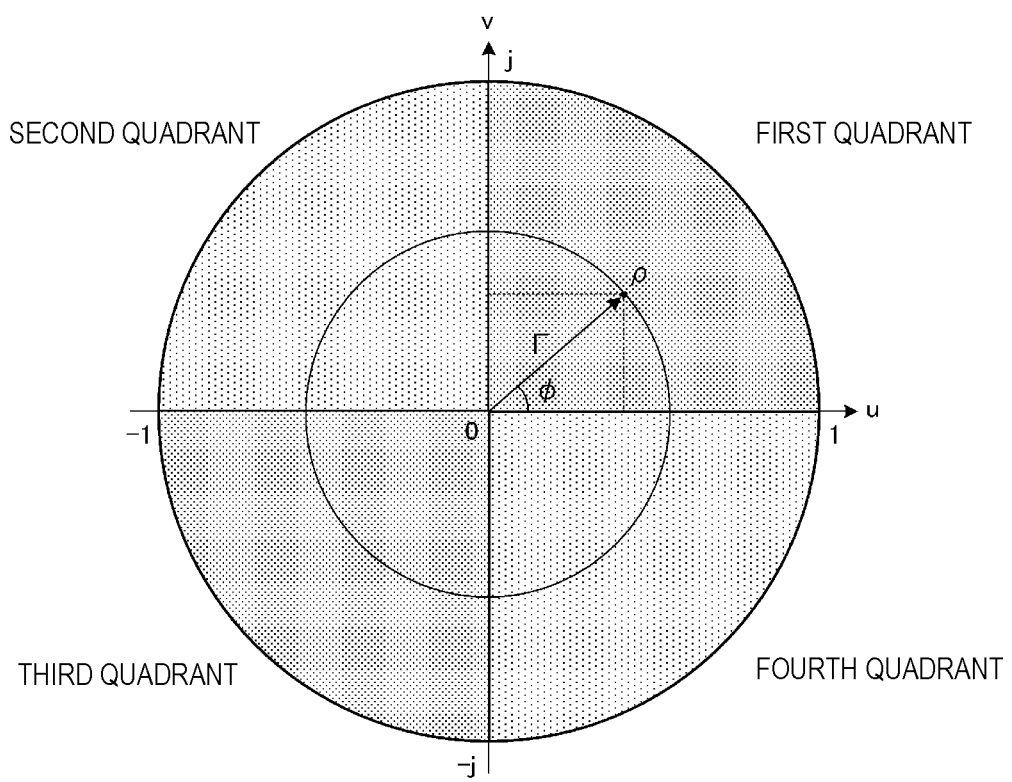
FIG. 14A is a diagram illustrating polar coordinates in a complex reflection coefficient ρ and four quadrants thereof.

First, quadrants are defined in order to express the position of a trajectory in polar coordinates of a reflection coefficient, obtained through a frequency sweep. FIG. 14A illustrates polar coordinates in a complex reflection coefficient ρ and four quadrants thereof. Here, a value on a horizontal axis u is a value of a real part of the reflection coefficient, and a value on a vertical axis v is a value of an imaginary part of the reflection coefficient. The complex reflection coefficient ρ can be plotted as a point in the polar coordinates. An absolute value of the reflection coefficient (a radius from a center 0,0) Γ is the magnitude of the reflection coefficient, and an angle φ from the horizontal axis u is a phase angle of a reflected signal. A region of the reflection coefficient in the polar coordinates where the real part is positive and the imaginary part is positive is indicated as a first quadrant, a region of the reflection coefficient in the polar coordinates where the real part is negative and the imaginary part is positive is indicated as a second quadrant, a region of the reflection coefficient in the polar coordinates where the real part is negative and the imaginary part is negative is indicated as a third quadrant, and a region of the reflection coefficient in the polar coordinates where the real part is positive and the imaginary part is negative is indicated as a fourth quadrant.

Figure 14B:
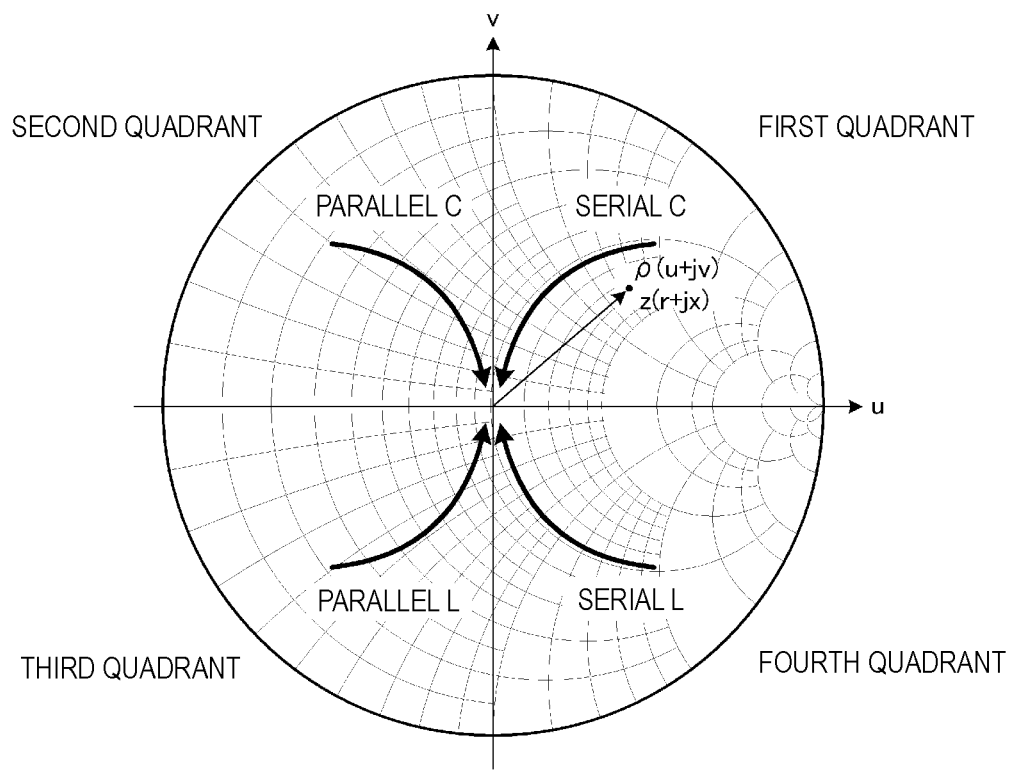
FIG. 14B is a diagram illustrating, on a Smith chart, an impedance corresponding to a complex reflection coefficient.

FIG. 14B is a diagram illustrating, on a Smith chart, an impedance corresponding to the stated complex reflection coefficient. A point ρ(u+jv) indicating the reflection coefficient in polar coordinates is a point z(r+jx) indicating the impedance on the Smith chart. In other words, the position of a point expressing the reflection coefficient in polar coordinates and the position of a point expressing the impedance on the Smith chart correspond with each other, and the trajectory of the reflection coefficient in polar coordinates obtained by making a frequency sweep is the trajectory of the impedance on the Smith chart. Note that FIG. 14B also illustrates a change in the impedance when a reactance element has been connected to the circuit. For example, when the impedance is near the center of the first quadrant, connecting a capacitor in series will bring the impedance toward the center of the Smith chart. Meanwhile, when the impedance is near the center of the second quadrant, connecting a capacitor in parallel will bring the impedance toward the center of the Smith chart. Likewise, when the impedance is near the center of the third quadrant, connecting an inductor in parallel will bring the impedance toward the center of the Smith chart, and when the impedance is near the center of the fourth quadrant, connecting an inductor in series will bring the impedance toward the center of the Smith chart.

In the present preferred embodiment and the comparative example, a low band preferably is 824 MHz to 960 MHz, and a high band preferably is 1.71 GHz to 2.17 GHz, for example.

Figure 16A:
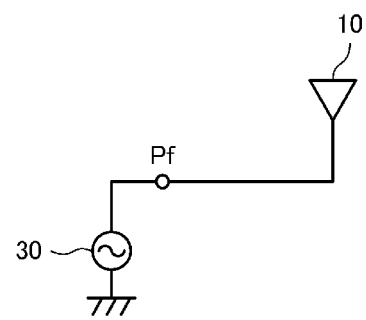
FIG. 16A is a circuit diagram illustrating a case where an impedance matching circuit is not provided.
Figure 16B:
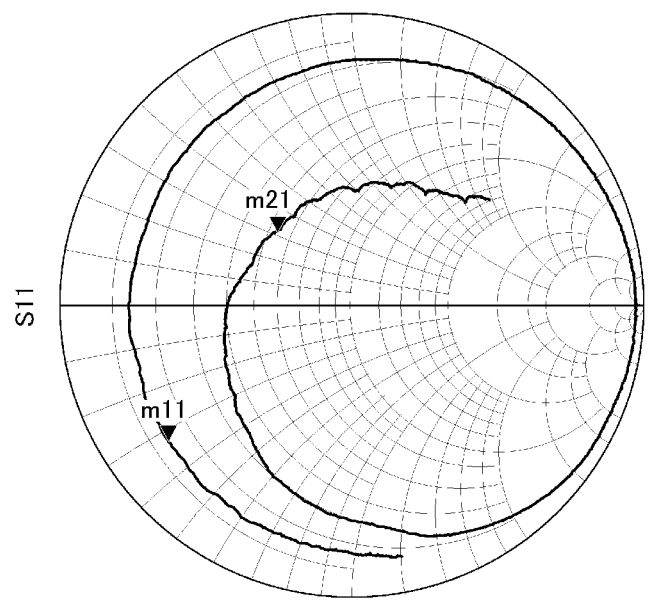
FIG. 16B is a diagram illustrating a trajectory of an impedance when the antenna element 10 is viewed from the power supply port Pf in FIG. 16A.

FIG. 16A is a circuit diagram illustrating a case where an impedance matching circuit is not provided, and FIG. 16B is a diagram illustrating a trajectory of an impedance when an antenna element 10 is viewed from a power supply port Pf. In FIG. 16B, a marker m11 corresponds to a center frequency of the low band, whereas m21 corresponds to a center frequency of the high band. The same applies in the other drawings referred to hereinafter.

Figure 17A:
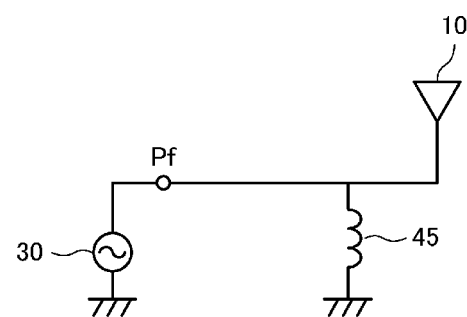
FIG. 17A is a circuit diagram illustrating a state in which a parallel-connected inductor 45 is provided for a signal line.
Figure 17B:
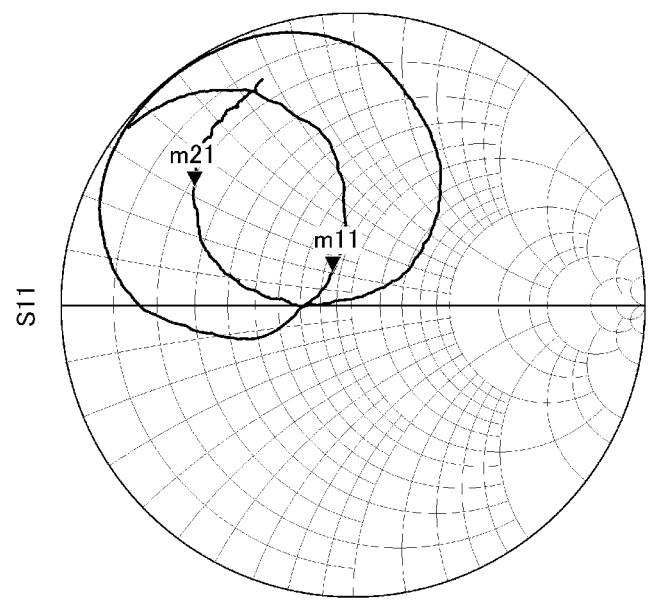
FIG. 17B is a diagram illustrating a trajectory of an impedance when the antenna element 10 side is viewed from the power supply port Pf in FIG. 17A.

FIG. 17A is a circuit diagram illustrating a state where a parallel-connected inductor 45 is provided for a signal line, whereas FIG. 17B is a diagram illustrating a trajectory of the impedance when the antenna element 10 side is viewed from the power supply port Pf. The impedance trajectory shifts to the second quadrant due to the effect of the parallel-connected inductor 45 provided for the signal line.

Figure 18A:
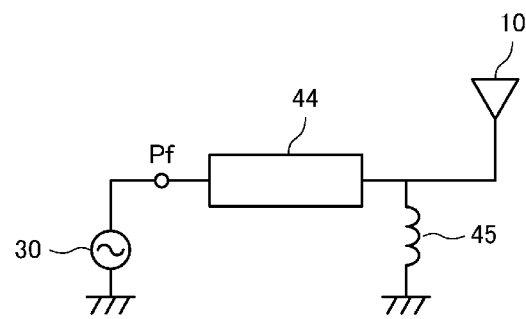
FIG. 18A is a circuit diagram illustrating a state in which a phase shifter 44 has been added in a transmission line.
Figure 18B:
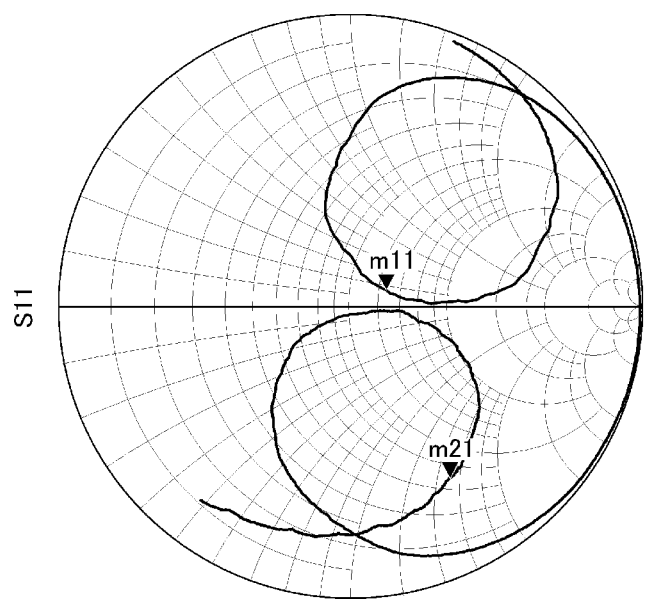
FIG. 18B is a diagram illustrating a trajectory of an impedance when the antenna element 10 side is viewed from the power supply port Pf in FIG. 18A.

FIG. 18A is a circuit diagram illustrating a state where a phase shifter 44 is added in a transmission line, whereas FIG. 18B is a diagram illustrating a trajectory of the impedance when the antenna element 10 side is viewed from the power supply port Pf. As indicated by the change from FIG. 17B to FIG. 18B, the impedance trajectory has rotated to the right central to the center of the Smith chart due to the phase shifter 44. As indicated in FIG. 17B, the impedance trajectory is in the second quadrant before the phase rotation, and thus the required phase rotation amount is great. Here, assuming a 52° rotation at 1 GHz, 300 mm (@1 GHz wave length)×0.67 (board relative permittivity)×52/360 (degrees)≈29 mm and thus a long transmission line of approximately 30 mm is required.

Note that the stated coefficient of 0.67 is a value resulting from a wavelength shortening effect caused by the effective relative permittivity of a board having a relative permittivity of approximately 3.

Meanwhile, the electric length of the transmission line is proportional to the frequency, and thus a phase rotation amount that is correct for the low band causes the phase of the high band to rotate excessively.

Figure 19A:
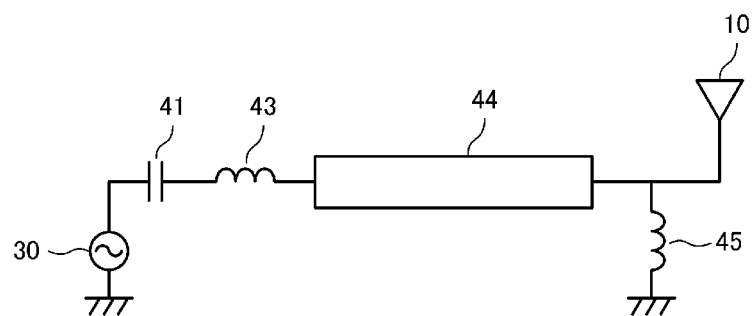
FIG. 19A is a circuit diagram illustrating a state in which a series-connected inductor 43 has further been added to a signal line and a series-connected capacitor 41 has further been added to a signal line.
Figure 19B:
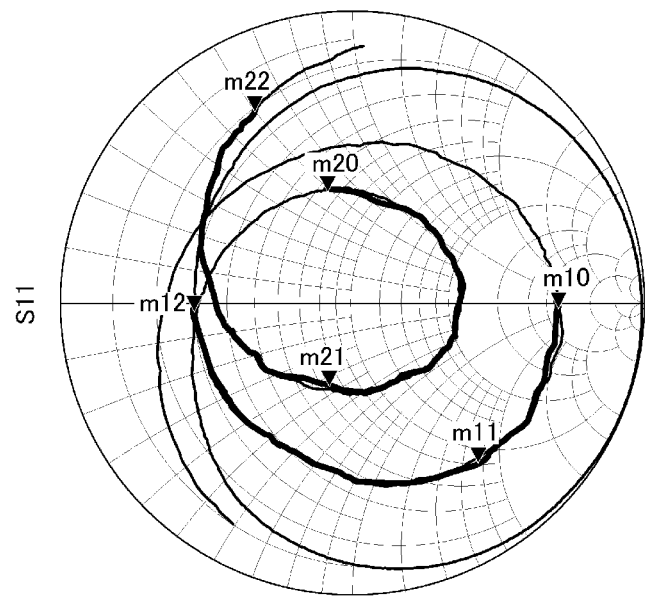
FIG. 19B is a diagram illustrating a trajectory of an impedance when the antenna element 10 side is viewed from the power supply port Pf in FIG. 19A.

FIG. 19A is a circuit diagram illustrating a state in which a series-connected inductor 43 is further added for the signal line and a series-connected capacitor 41 is further added for the signal line, whereas FIG. 19B is a diagram illustrating the trajectory of the impedance when the antenna element 10 side is viewed from the power supply port Pf. Based on the state illustrated in FIG. 18B, in the case where the impedance trajectory has been shifted using the series-connected inductor for the signal line and the series-connected capacitor for the signal line, ensuring correct matching for the low band, for example, makes it difficult to achieve matching for the high band.

An impedance conversion circuit according to the first preferred embodiment of the present invention will be described next.

Figure 1:
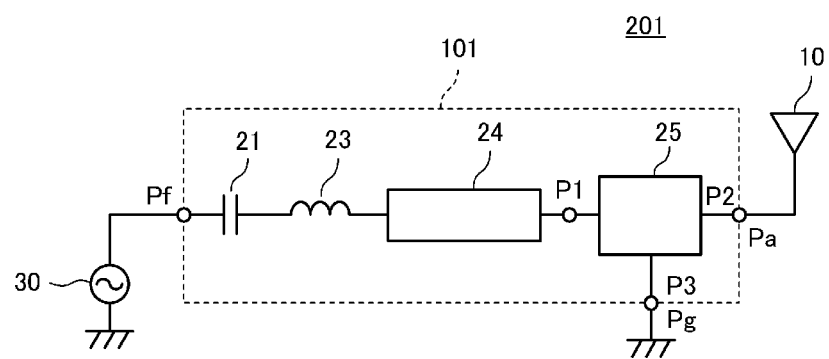
FIG. 1 is a circuit diagram illustrating an antenna apparatus 201 including an impedance conversion circuit 101 according to a first preferred embodiment of the present invention.

FIG. 1 is a circuit diagram illustrating an antenna apparatus 201 including an impedance conversion circuit 101 according to the first preferred embodiment of the present invention. The antenna apparatus 201 includes the impedance conversion circuit 101 and an antenna element 10, and a power supply circuit 30 is connected to the antenna apparatus 201.

The antenna element 10 preferably is a wide-band antenna that resonates in a fundamental wave (for example, ¼ wave length) mode in a low band and resonates in a harmonic (for example, ¾ wave length) mode in a high band. The impedance conversion circuit 101 is connected to a power supply end of the antenna element 10. In other words, the power supply circuit 30 is connected to the power supply port Pf of the impedance conversion circuit 101, and an antenna port Pa is connected to the antenna element 10. Meanwhile, a ground port Pg is grounded.

The impedance conversion circuit 101 includes an auto-transformer circuit 25, a phase shifter 24, an inductor 23, and a capacitor 21.

Figure 2:
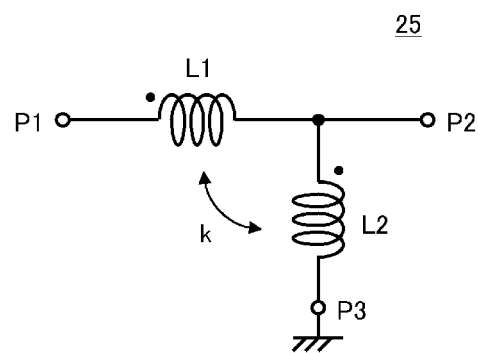
FIG. 2 is a circuit diagram illustrating an auto-transformer circuit 25.

FIG. 2 is a circuit diagram illustrating the auto-transformer circuit 25. The auto-transformer circuit 25 includes a first inductor L1 connected between a first port P1 connected to a power supply portion side and a second port P2 connected on an antenna side, and a second inductor L2 connected between a third port P3 that is grounded and the second port P2. The first inductor L1 and the second inductor L2 are coupled.

As illustrated in FIG. 1, a first end of the phase shifter 24 is connected to the first port P1 of the auto-transformer circuit 25, and the inductor 23 is connected in series to a second end of the phase shifter 24. The capacitor 21 is connected in series between the inductor 23 and the power supply port Pf.

The phase shifter 24 is a high-frequency transmission line having a predetermined electric length, such as a strip line, a microstrip line, a coplanar line, or the like, for example, and although the phase shifter 24 may be incorporated into a multilayer body through integration with the impedance conversion circuit, it is preferable, from the standpoint of adjustability, that the phase shifter 24 be provided on a circuit board on which the multilayer body is to be mounted.

Figure 3:
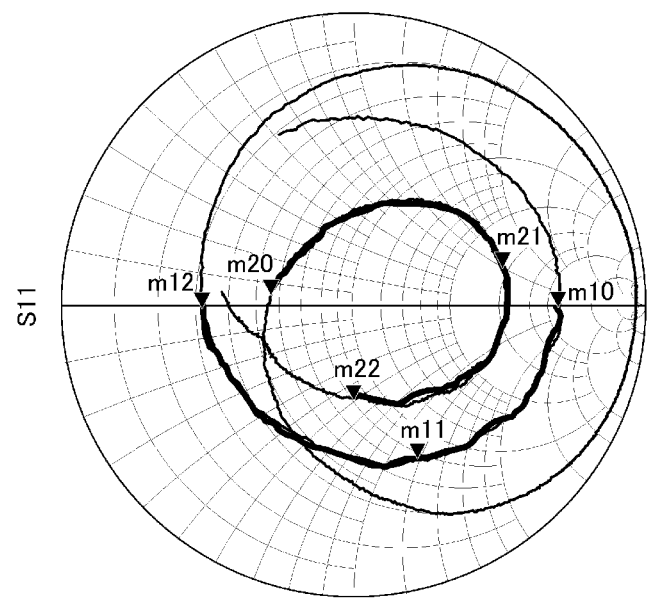
FIG. 3 is a diagram illustrating, on a Smith chart, the trajectory of an impedance when viewing an antenna side from a power supply port Pf of the impedance conversion circuit 101 illustrated in FIG. 1.

FIG. 3 is a diagram illustrating, on a Smith chart, the trajectory of an impedance when viewing an antenna side from the power supply port Pf of the impedance conversion circuit 101 illustrated in FIG. 1. The frequency sweep range here preferably is 700 MHz to 2.3 GHz, for example. Relationships between the respective markers and frequencies are as follows.

m10: 824 MHz
m11: 892 MHz
m12: 960 MHz
m20: 1.71 GHz
m21: 1.94 GHz
m22: 2.17 GHz

As mentioned above, the marker m11 corresponds to the center frequency of the low band, whereas m21 corresponds to the center frequency of the high band.

Next, the actions of the respective elements in the impedance conversion circuit 101 will be described in order.

Figure 4A:
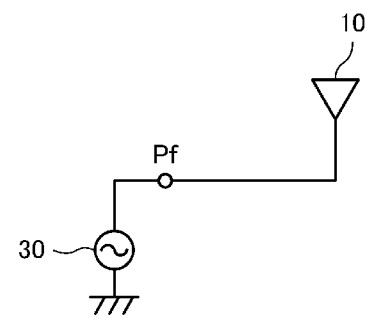
FIG. 4A is a circuit diagram illustrating a case where the impedance conversion circuit 101 is not provided.
Figure 4B:
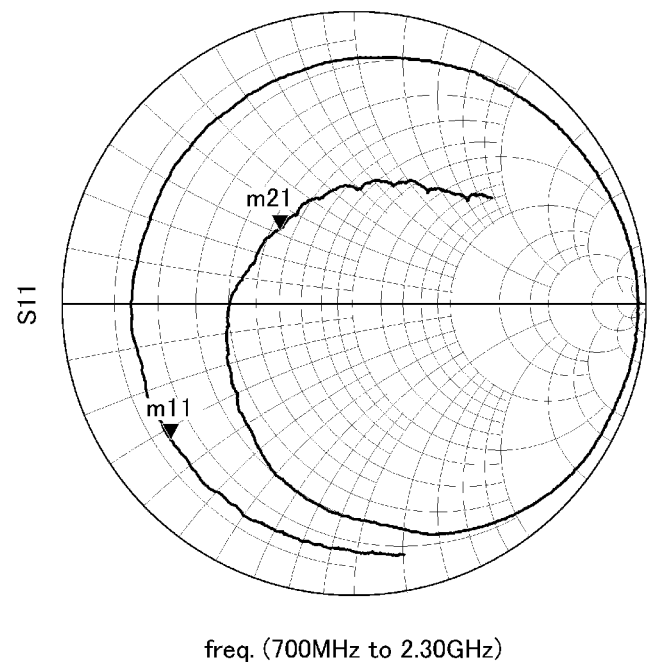
FIG. 4B is a diagram illustrating a trajectory of an impedance when an antenna element 10 is viewed from the power supply port Pf.

FIG. 4A is a circuit diagram illustrating a case where the impedance conversion circuit 101 is not provided, and FIG. 4B is a diagram illustrating the trajectory of an impedance when the antenna element 10 is viewed from the power supply port Pf. FIGS. 4A and 4B are the same as FIGS. 16A and 16B that illustrate the comparative example.

Figure 5A:
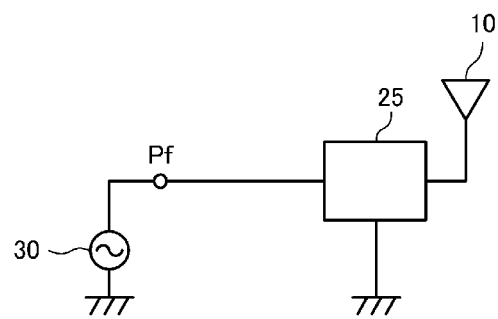
FIG. 5A is a circuit diagram illustrating a state in which the auto-transformer circuit 25 is provided.
Figure 5B:
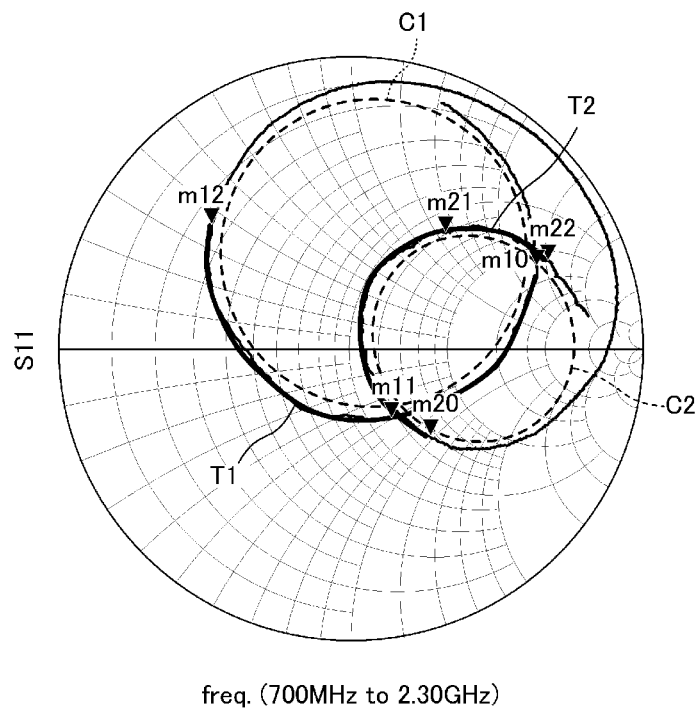
FIG. 5B is a diagram illustrating a trajectory of an impedance when an antenna element 10 side is viewed from the power supply port Pf in FIG. 5A.
Figure 5C:
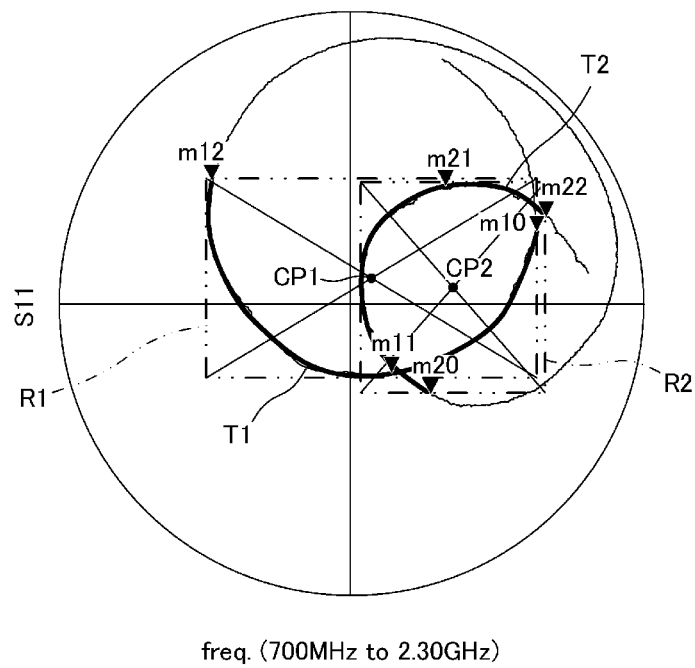
FIG. 5C is a diagram illustrating a center CP1 of a first trajectory T1 and a center CP2 of a second trajectory T2.
Figure 5D:
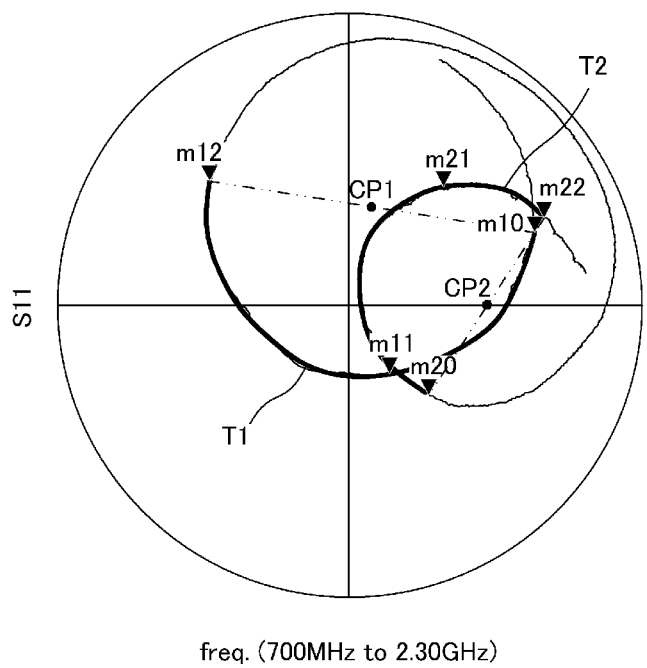
FIG. 5D is a diagram illustrating the center CP1 of the first trajectory T1 and the center CP2 of the second trajectory T2.

FIG. 5A is a circuit diagram illustrating a state where the auto-transformer circuit 25 is provided, and FIG. 5B is a diagram illustrating the trajectory of an impedance when the antenna element 10 side is viewed from the power supply port Pf. FIGS. 5C and 5D are both diagrams illustrating the center CP1 of the first trajectory T1 and the center CP2 of the second trajectory T2.

In FIG. 5B, a trajectory from the marker m10 to m12 is a trajectory in the low band ("first trajectory" hereinafter). Meanwhile, a trajectory from the marker m20 to m22 is a trajectory in the high band ("second trajectory" hereinafter). As illustrated in FIG. 5B, the antenna element 10 resonates at an odd-numbered multiple of ¼ wave length with the low band and the high band, with the first trajectory T1 tracing an almost circular arc along a circle C1 and the second trajectory T2 tracing an almost circular arc along a circle C2.

The auto-transformer circuit 25 sets an impedance ratio so that the impedance viewed from the power supply port Pf increases, and as indicated by the change from FIG. 4B to FIG. 5B, the range of the impedance trajectory on the Smith chart shrinks and shifts to the right. However, as will be described later, the auto-transformer circuit 25 is not an ideal transformer, and has frequency characteristics in an impedance conversion ratio. As such, in FIG. 5B, the center of the first trajectory T1 is shifted to the first quadrant or the second quadrant, and the center of the second trajectory T2 is shifted to the first quadrant or the fourth quadrant.

The center of the first trajectory T1 and the center of the second trajectory T2 can be defined through several methods, as described below.

In the example illustrated in FIG. 5C, for the first trajectory T1, an average of the maximum value and the minimum value of the real part of the reflection coefficient is taken as the real part of the center CP1 of the first trajectory T1, and for the first trajectory T1, an average of the maximum value and the minimum value of the imaginary part is taken as the imaginary part of the center CP1 of the first trajectory T1. The center CP1 determined in this manner is used as a representative position of the first trajectory T1. The center of a rectangle R1 that circumscribes the first trajectory T1 corresponds to the center CP1 of the first trajectory T1. Likewise, for the second trajectory T2, an average of the maximum value and the minimum value of the real part of the reflection coefficient is taken as the real part of the center CP2 of the second trajectory T2, and for the second trajectory T2, an average of the maximum value and the minimum value of the imaginary part is taken as the imaginary part of the center CP2 of the second trajectory T2. The center CP2 determined in this manner is used as a representative position of the second trajectory T2. The center of a rectangle R2 that circumscribes the second trajectory T2 corresponds to the center CP2 of the second trajectory T2.

In the example illustrated in FIG. 5D, an intermediate point CP1 in polar coordinates between the reflection coefficient at a lower limit frequency (the marker m10) of the first trajectory and the reflection coefficient at an upper limit frequency (the marker m12) is used as a position (a representative position) of the first trajectory. Likewise, an intermediate point CP2 in polar coordinates between the reflection coefficient at a lower limit frequency (the marker m20) of the second trajectory and the reflection coefficient at an upper limit frequency (the marker m22) is used as a position (a representative position) of the second trajectory.

Other definitions of the center of the trajectory in the low band (the first trajectory) and the center of the trajectory in the high band (the second trajectory) will be given later.

Figure 6A:
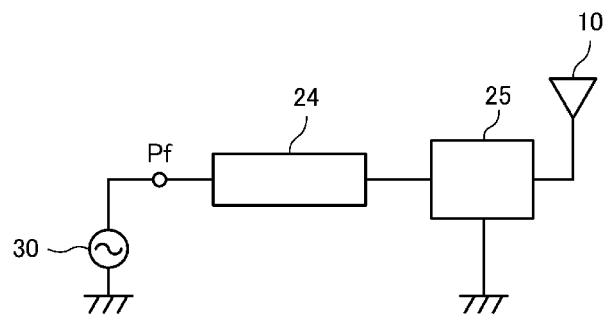
FIG. 6A is a circuit diagram illustrating a state in which a phase shifter 24 has been added.
Figure 6B:
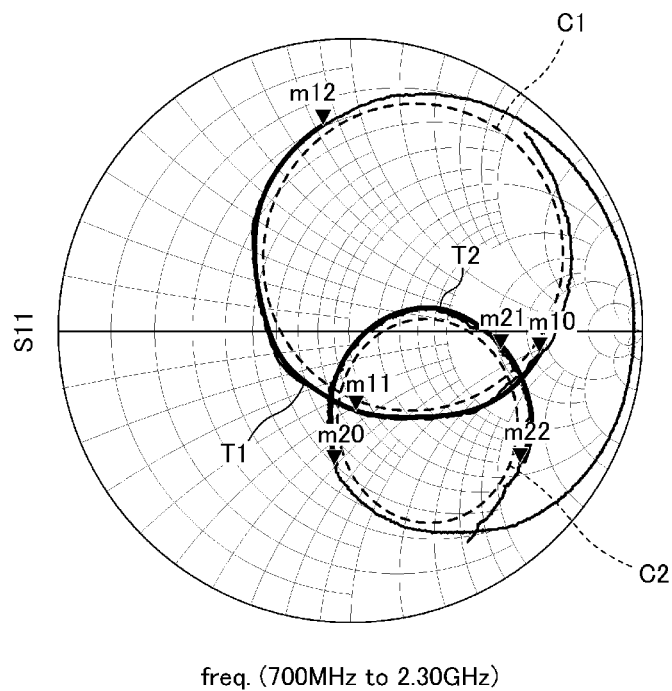
FIG. 6B is a diagram illustrating a trajectory of an impedance when the antenna element 10 side is viewed from the power supply port Pf in FIG. 6A.
Figure 6C:
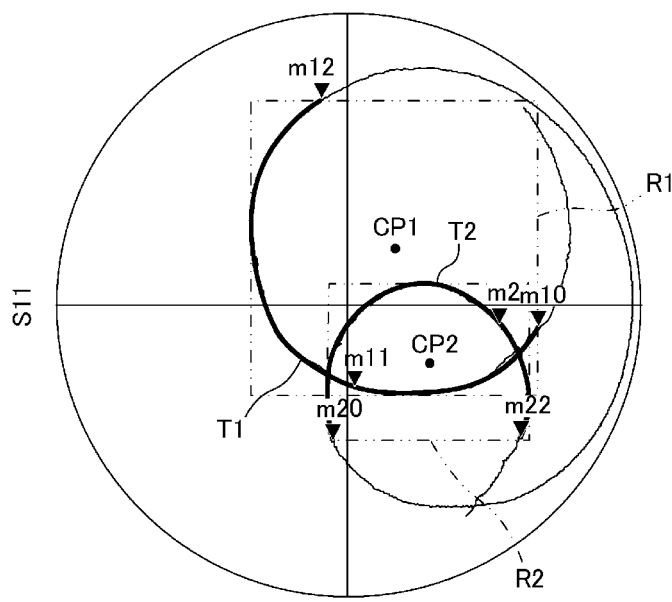
FIG. 6C is a diagram illustrating the center CP1 of the first trajectory T1 and the center CP2 of the second trajectory T2.
Figure 6D:
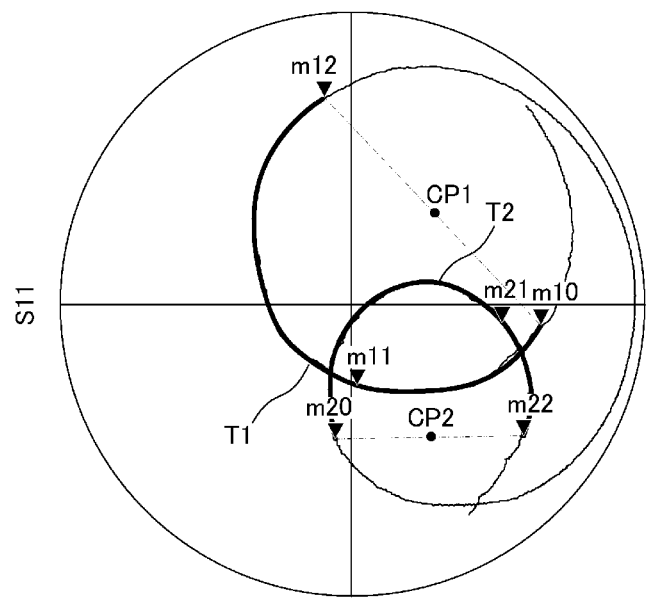
FIG. 6D is a diagram illustrating the center CP1 of the first trajectory T1 and the center CP2 of the second trajectory T2.

FIG. 6A is a circuit diagram illustrating a state where the phase shifter 24 has been added, whereas FIG. 6B is a diagram illustrating the trajectory of the impedance when the antenna element 10 side is viewed from the power supply port Pf. FIGS. 6C and 6D are both diagrams illustrating the center CP1 of the first trajectory T1 and the center CP2 of the second trajectory T2.

The phase shifter 24 corresponds to a "first phase shifter", and in this example is a transmission line at a reference impedance (for example, 50Ω). As indicated by the change from FIG. 5B to FIG. 6B, the first trajectory T1 and the second trajectory T2 have rotated to the right central to the center of the Smith chart due to the phase shifter 24. As a result of the rotation, the center CP1 of the first trajectory T1 is in the first quadrant and the center CP2 of the second trajectory T2 is in the fourth quadrant.

In the state illustrated in FIG. 5B, the center frequency of the low band, indicated by the marker m11, is near the center of the Smith chart, and thus the phase rotation produced by the phase shifter 24 acts on the high band in particular (see the second trajectory T2).

For example, assuming a transmission line that rotates by 15° at 1 GHz is added as the phase shifter 24, the first trajectory T1 does not even rotate 15°, and thus the center CP1 remains in the first quadrant; however, the second trajectory T2 rotates 15° or more, and thus the center CP2 shifts as far as the center of the fourth quadrant.

300 mm (@1 GHz wave length)×0.67 (board relative permittivity)×15/360 (degrees)≈8.4 mm and thus the line length of the transmission line serving as the phase shifter 24 can be less than approximately 10 mm.

Figure 7A:
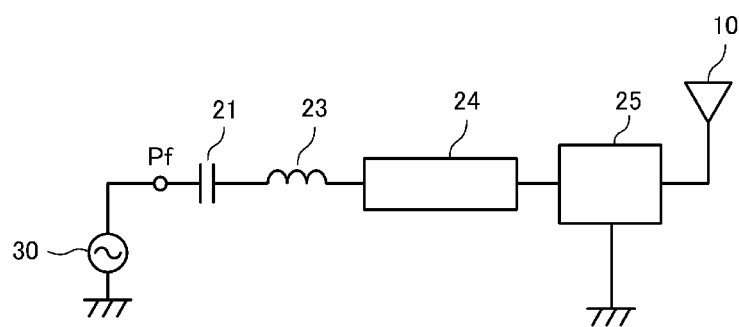
FIG. 7A is a circuit diagram illustrating a state in which a series-connected inductor 23 has further been added to a signal line and a series-connected capacitor 21 has further been added to a signal line.
Figure 7B:
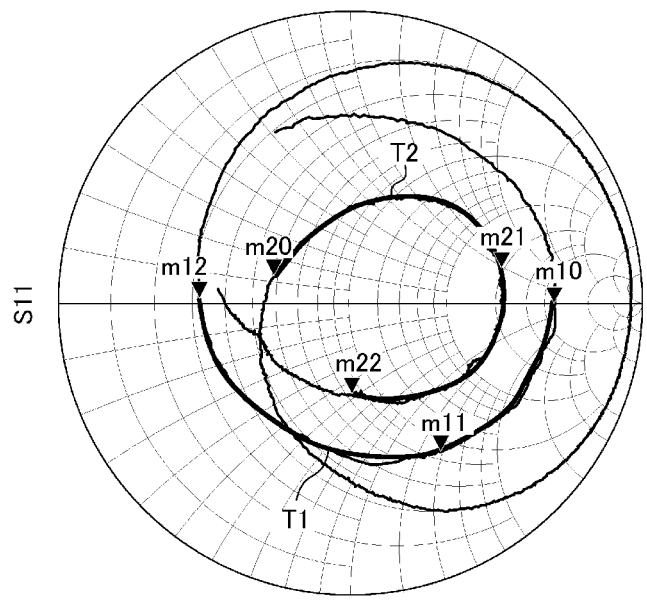
FIG. 7B is a diagram illustrating a trajectory of an impedance when the antenna element 10 side is viewed from the power supply port Pf in FIG. 7A.
Figure 7C:
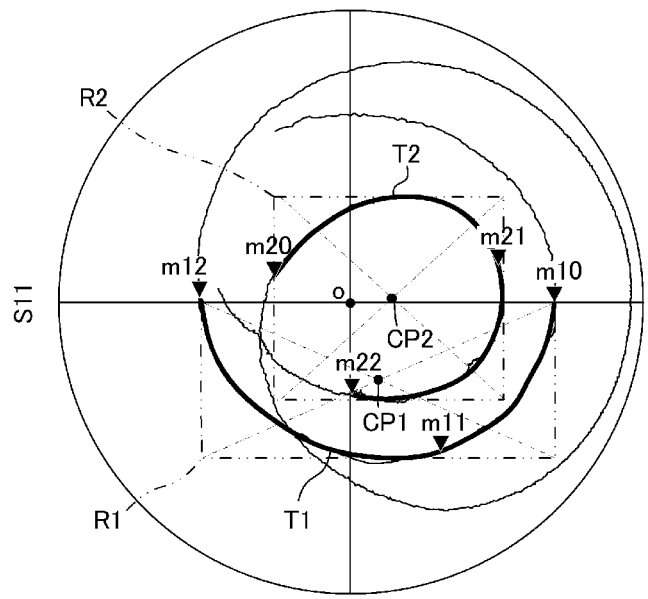
FIG. 7C is a diagram illustrating the center CP1 of the first trajectory T1 and the center CP2 of the second trajectory T2.
Figure 7D:
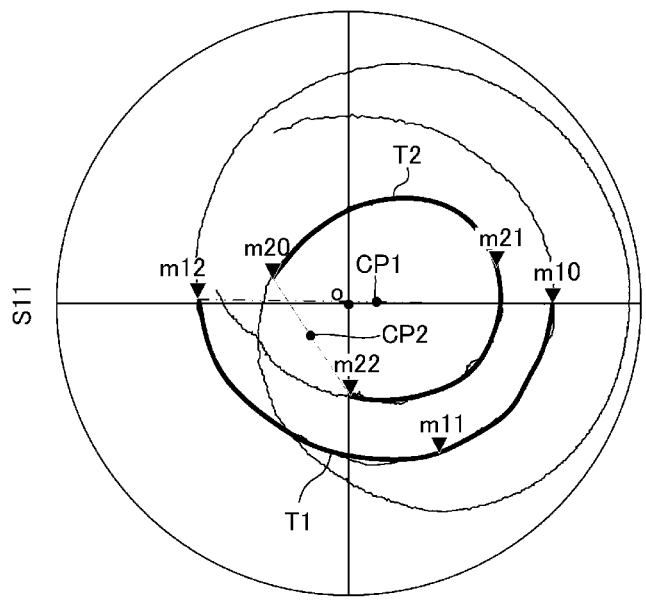
FIG. 7D is a diagram illustrating the center CP1 of the first trajectory T1 and the center CP2 of the second trajectory T2.

FIG. 7A is a circuit diagram illustrating a state in which the series-connected inductor 23 is further added for the signal line and the series-connected capacitor 21 is further added for the signal line, whereas FIG. 7B is a diagram illustrating the trajectory of the impedance when the antenna element 10 side is viewed from the power supply port Pf. FIGS. 7C and 7D are both diagrams illustrating the center CP1 of the first trajectory T1 and the center CP2 of the second trajectory T2.

FIG. 7A corresponds to the antenna apparatus 201 illustrated in FIG. 1. The inductor 23 connected in series to the signal line shifts the impedance in the fourth quadrant toward the center of the Smith chart, as indicated in FIG. 14B. The reactance of the series-connected inductor is $2\pi fL$, and thus the amount of shift in the impedance trajectory caused by the inductor 23 acts more effectively on the high-frequency high band than on the low band. Meanwhile, the capacitor 21 connected in series to the signal line shifts the impedance in the first quadrant toward the center of the Smith chart, as indicated in FIG. 14B. The reactance of the series-connected capacitor is $1/2\pi fC$, and thus the amount of shift in the impedance trajectory caused by the capacitor 21 acts more effectively on the low-frequency low band than on the high band. As a result, as indicated by the change from FIG. 6B to FIG. 7B, the center CP2 of the second trajectory T2 illustrated in FIG. 6B shifts toward a center o of the Smith chart, and the center of the first trajectory T1 also shifts toward the center o of the Smith chart.

In this manner, as illustrated in FIGS. 7B and 3, the impedance conversion circuit 101, which achieves favorable matching in both the low band and the high band, is provided.

Figure 8:
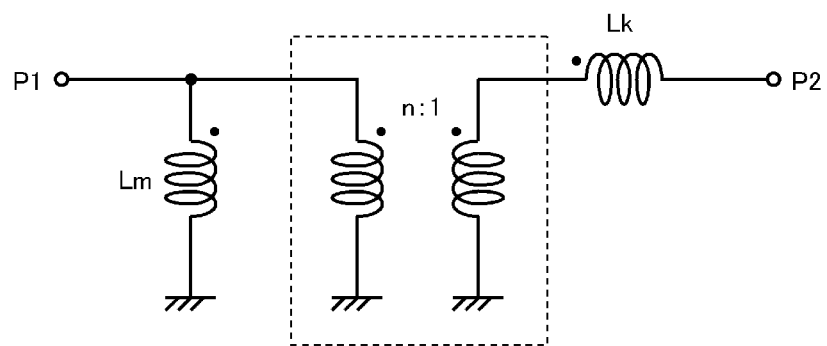
FIG. 8 is an equivalent circuit diagram illustrating the auto-transformer circuit 25.

FIG. 8 is an equivalent circuit diagram illustrating the auto-transformer circuit 25. The equivalent circuit of the auto-transformer circuit 25 includes, as illustrated in FIG. 8, an ideal transformer having a transformation ratio of n:1 (the broken line area), an inductance Lm connected in parallel, and an inductance Lk connected in series. Here, when the inductance of the first inductor L1 is represented by L1, the inductance of the second inductor is represented by L2, and a coupling coefficient is represented by k, the value of the inductance Lm is L1+L2+2M. Meanwhile, the value of the inductance Lk is $\{(1-k^2)*L1*L2\}/(L1+L2+2M)$. Accordingly, in the case where the coupling coefficient k is 1, the equivalent circuit is only the ideal transformer portion, and a frequency dependence on the impedance conversion ratio does not appear. When the stated coupling coefficient k is lower than 1, the inductance Lk, which is a parasitic component, arises, and the frequency dependence appears. Meanwhile, the inductance Lm has a greater influence (cannot be ignored) in a high-frequency transformer when the inductance values of L1 and L2 are low. Accordingly, as will be described hereinafter, the auto-transformer circuit 25 carries out impedance conversion using the transformer, and changes the state of the impedance trajectory shift between the low band and the high band by using the stated parasitic component.

The inductance Lm illustrated in FIG. 8 is a parallel-connected inductor that acts effectively in the low band. In other words, as indicated by the first trajectory T1 in FIG. 5B, the center CP1 of the first trajectory T1 shifts to the first quadrant by the action of the inductor connected in parallel to the signal line. Meanwhile, the inductance Lk illustrated in FIG. 8 is a series-connected inductor that acts effectively in the high band. In other words, as indicated by the second trajectory T2 in FIG. 5B, the center CP2 of the second trajectory T2 shifts to the fourth quadrant by the action of the inductor connected in series to the signal line.

Figure 15A:
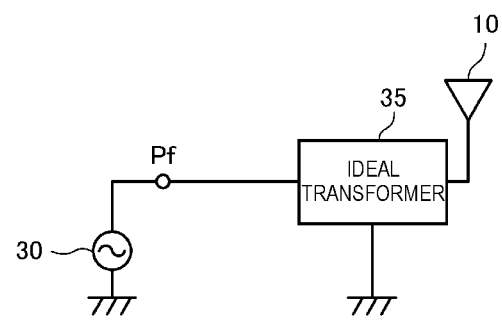
FIG. 15A is a diagram illustrating an example in which an ideal transformer 35 is connected between the antenna element 10 and a power supply circuit 30.
Figure 15B:
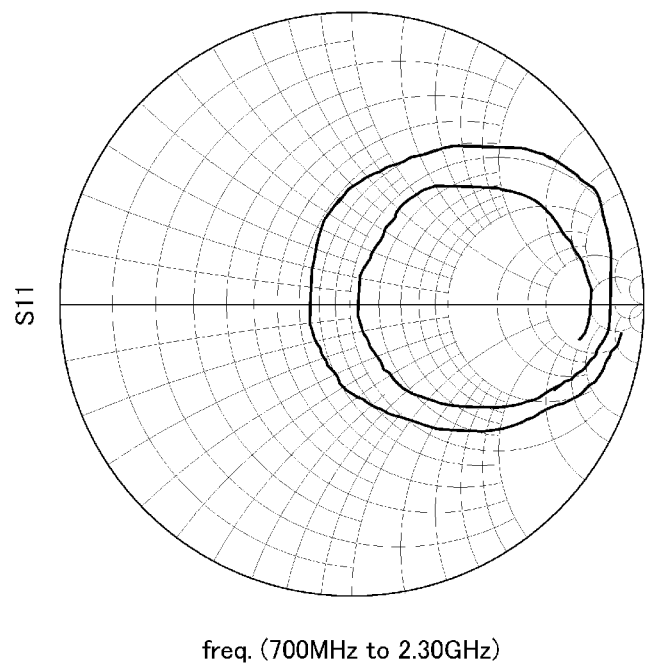
FIG. 15B is a diagram illustrating a trajectory of an impedance when the antenna element 10 side is viewed from the power supply port Pf in FIG. 15A.

Here, impedance conversion using an ideal transformer will be described as a comparative example based on FIGS. 15A and 15B. FIG. 15A illustrates an example in which an ideal transformer 35 is connected between the antenna element 10 and the power supply circuit 30, and FIG. 15B is a diagram illustrating the trajectory of an impedance when the antenna element 10 side is viewed from the power supply port Pf in this case. As indicated by the change from FIG. 4B to FIG. 15B, the range of the impedance trajectory on the Smith chart shrinks and shifts to the right. However, because the impedance conversion ratio is the same for both the low band and the high band, both impedance trajectories are located in a range spanning the first quadrant and the fourth quadrant of the Smith chart. As such, even if a phase shifter using a transmission line is added to the circuit illustrated in FIG. 15A, it is difficult to achieve matching for both the low band and the high band.

The relationships between the markers and frequencies described in the comparative example with reference to FIG. 19B are the same as the relationships between the markers and frequencies described in the present preferred embodiment with reference to FIG. 3. As is clear by comparing these drawings, in the case of the comparative example, prioritizing one of the low band and the high band worsens the matching in the other, but according to the present preferred embodiment, favorable matching is achieved for both the low band and the high band.

Figure 9:
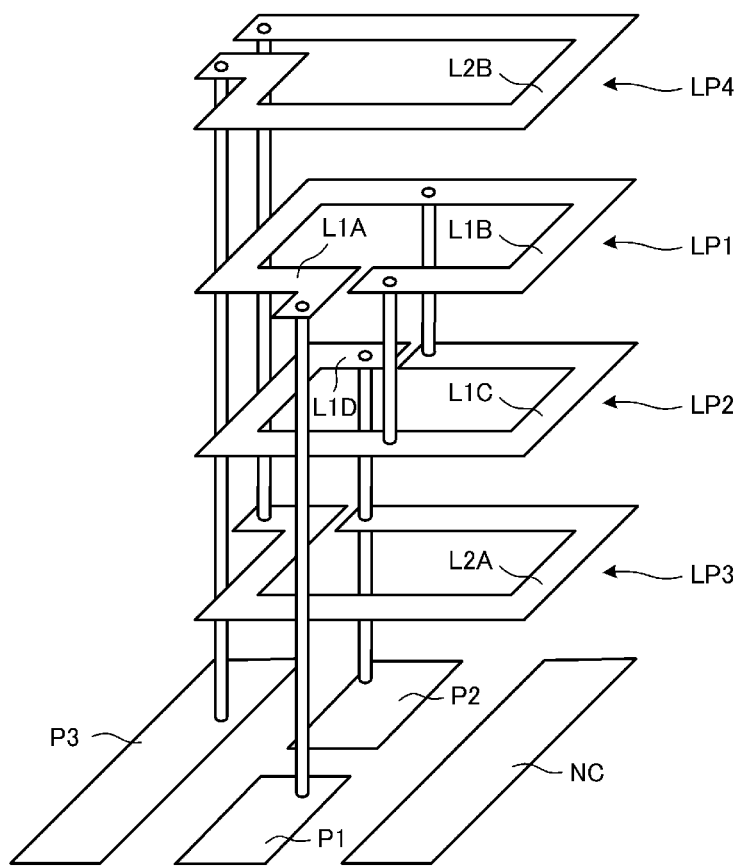
FIG. 9 is a perspective view of various types of conductor patterns in the auto-transformer circuit 25.
Figure 10:
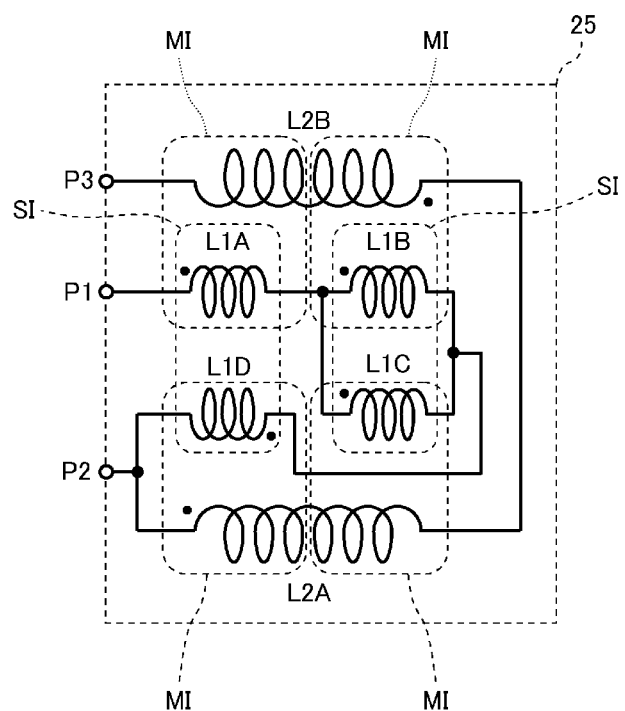
FIG. 10 is a circuit diagram illustrating the auto-transformer circuit 25 taking into consideration the positional relationship between a primary coil and a secondary coil in a multilayer element.

Next, a specific example of the configuration of the auto-transformer circuit 25 will be described. FIG. 9 is a perspective view of various types of conductor patterns in the auto-transformer circuit 25. Dielectric base material layers on which these conductor patterns are provided are omitted in the drawings. FIG. 10 is a circuit diagram illustrating the auto-transformer circuit 25 taking into consideration the positional relationship between a primary coil and a secondary coil in a multilayer element.

In FIGS. 9 and 10, conductor patterns L1A, L1B, L1C, and L1D correspond to the first inductor (indicated by L1 in FIG. 2), whereas conductor patterns L2A and L2B correspond to the second inductor (indicated by L2 in FIG. 2).

As illustrated in FIG. 9, a first loop-shaped conductor LP1 including the conductor patterns L1A and L1B, a second loop-shaped conductor LP2 including the conductor patterns L1C and L1D, a third loop-shaped conductor LP3 including the conductor pattern L2A, and a fourth loop-shaped conductor LP4 including the conductor pattern L2B are provided. The conductor patterns in the respective layers are interlayer-connected by via conductors.

Terminals corresponding to a first port (a power supply port) P1, a second port (an antenna port) P2, and a third port (a ground port) P3, as well as other terminals for mounting (an open terminal NC), are provided on a bottom surface of the base material layer that defines and serves as the lowermost layer. These terminals are provided on the bottom surface of the base material layer that defines and serves as the lowermost layer.

The first inductor L1 includes the first loop-shaped conductor LP1 and the second loop-shaped conductor LP2. The second inductor L2 includes the third loop-shaped conductor LP3 and the fourth loop-shaped conductor LP4.

The first loop-shaped conductor LP1 and the second loop-shaped conductor LP2 are interposed between the third loop-shaped conductor LP3 and the fourth loop-shaped conductor LP4 in a layering direction.

The conductor pattern L1B, which is part of the first loop-shaped conductor LP1, and the conductor pattern L1C, which is part of the second loop-shaped conductor LP2, are connected in parallel. The conductor pattern L1A, which is the remaining part of the first loop-shaped conductor LP1, and the conductor pattern L1D, which is the remaining part of the second loop-shaped conductor LP2, are each connected in series to the stated parallel circuit.

The third loop-shaped conductor LP3 including the conductor pattern L2A and the fourth loop-shaped conductor LP4 including the conductor pattern L2B are connected in series.

As illustrated in FIG. 10, the first inductor L1 achieves a high inductance value through a strong magnetic field coupling between the conductor patterns L1A and L1D (self-induction SI) and a strong magnetic field coupling between the conductor patterns L1B and L1C (self-induction SI). Accordingly, the inductance per unit of coil length is high, and the Q value of the first inductor L1 is improved, which reduces loss.

Meanwhile, a coupling coefficient between the first inductor L1 and the second inductor L2 is increased by magnetic field coupling between the conductor patterns L1A and L1B and the conductor pattern L2B (mutual induction MI) and magnetic field coupling between the conductor patterns L1C and L1D and the conductor pattern L2A (mutual induction MI).

With such a structure, the inductance value is able to be changed as desired while maintaining the area of an opening in the loop conductors (that is, while maintaining a state of a high coupling coefficient) in a small amount of space.

Figure 11A:
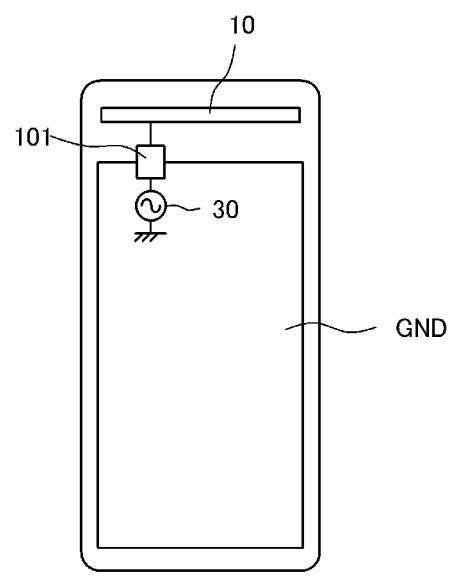
FIG. 11A is a diagram illustrating the configuration of a wireless communication apparatus such as a cellular phone terminal that includes an antenna apparatus.

FIG. 11A is a diagram illustrating the configuration of a wireless communication apparatus such as a cellular phone terminal that includes the antenna apparatus described above. FIG. 11A illustrates only the primary components elements within a housing of the wireless communication apparatus. The antenna element 10 and a circuit board are provided within the housing, a ground conductor GND is provided in the circuit board, and the impedance conversion circuit 101 and the power supply circuit 30 are provided. In the low band, the antenna element 10 resonates at ¼ wave length across the longer portion thereof. In the high band, the antenna element 10 resonates at ¼ wave length across the shorter portion thereof, or resonates at ¾ wave length across the entirety of the antenna element 10.

In addition to this type of T-branched antenna element, a monopole antenna, an inverted-F antenna, or the like may be used as the antenna element 10. In any of these cases, the low band generally corresponds to the fundamental wave mode and the high band generally corresponds to the harmonic mode.

Figure 11B:
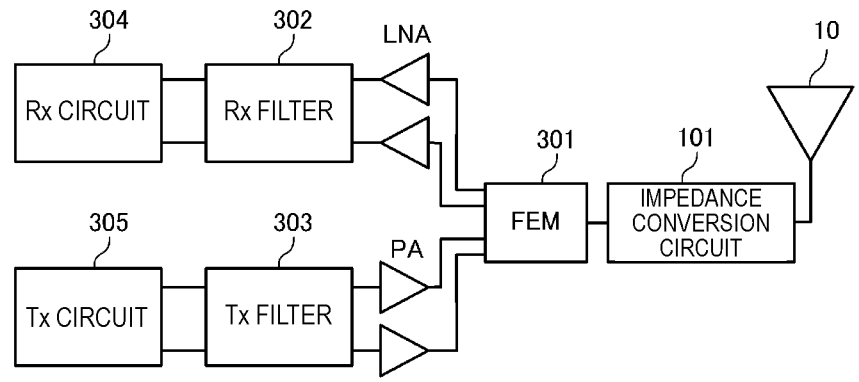
FIG. 11B is a block diagram illustrating circuits of the wireless communication apparatus.

FIG. 11B is a block diagram illustrating circuits of the wireless communication apparatus. A front-end circuit 301 is connected to the impedance conversion circuit 101. The front-end circuit 301 includes a low band reception signal output portion, a high band reception signal output portion, a low band transmission signal input portion, and a high band transmission signal input portion. A reception signal outputted from the reception signal output portion of the front-end circuit 301 is amplified by a low-noise amplifier LNA for low band and high band, passes through a reception signal filter 302 that is a dual filter, and is inputted into a reception circuit 304. An output signal of a transmission circuit 305 passes through a transmission signal filter 303 that is a dual filter, is amplified by a power amplifier PA for low band and high band, and is inputted into the transmission signal input portion of the front-end circuit 301.

Second Preferred Embodiment

Figure 12A:
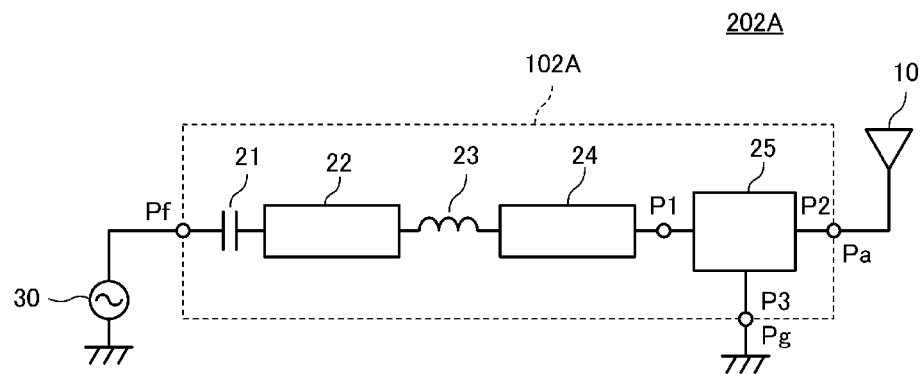
FIG. 12A is a circuit diagram illustrating an antenna apparatus 202A including an impedance conversion circuit 102A according to a second preferred embodiment of the present invention.
Figure 12B:
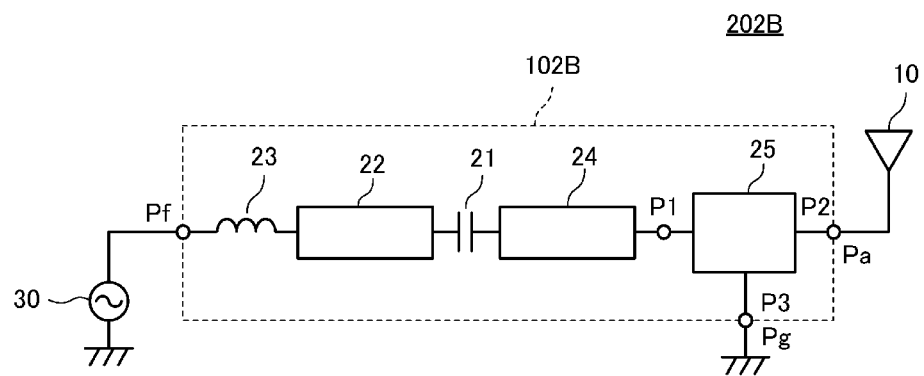
FIG. 12B is a circuit diagram illustrating an antenna apparatus 202B including an impedance conversion circuit 102B according to the second preferred embodiment of the present invention.

FIG. 12A is a circuit diagram illustrating an antenna apparatus 202A including an impedance conversion circuit 102A according to a second preferred embodiment of the present invention. FIG. 12B is a circuit diagram illustrating an antenna apparatus 202B including an impedance conversion circuit 102B according to the second preferred embodiment. The antenna apparatus 202A includes the impedance conversion circuit 102A and the antenna element 10, and the power supply circuit 30 is connected to the antenna apparatus 202A. Likewise, the antenna apparatus 202B includes the impedance conversion circuit 102B and the antenna element 10, and the power supply circuit 30 is connected to the antenna apparatus 202B.

The impedance conversion circuits 102A and 102B illustrated in FIGS. 12A and 12B differ from the impedance conversion circuit 101 illustrated in FIG. 1 in that a phase shifter 22 is provided between the inductor 23 and the capacitor 21. The phase shifter 22 corresponds to a "second phase shifter", and in this example is a transmission line at a reference impedance (for example, 50Ω). Meanwhile, the impedance conversion circuits 102A and 102B differ in that the inductor 23 is connected on the first phase shifter 24 side or the capacitor 21 is connected on the first phase shifter 24 side.

Actions of the second phase shifter 22 in the case of the impedance conversion circuit 102A illustrated in FIG. 12A are as follows.

When the inductor 23 is added in the state described in the first preferred embodiment with reference to FIG. 6A, the center CP2 of the second trajectory T2 in particular shifts toward the center of the Smith chart in FIGS. 6C and 6D.

Next, when the second phase shifter 22 illustrated in FIG. 12A is added, the impedance trajectory rotates to the right, but because the center CP2 of the second trajectory T2 is already near the center of the Smith chart at this time, the second phase shifter 22 has almost no effect.

Next, when the capacitor 21 illustrated in FIG. 12A is added, the center of the first trajectory T1 shifts near the center of the Smith chart.

In this manner, it is easier to carry out accurate low band matching when the phase is rotated by the second phase shifter 22 while in a state where the center CP2 of the second trajectory T2 is already near the center of the Smith chart (that is, a state of high band matching).

Actions of the second phase shifter 22 in the case of the impedance conversion circuit 102B illustrated in FIG. 12B are as follows.

When the capacitor 21 is added in the state described in the first preferred embodiment with reference to FIG. 6A, the center CP1 of the first trajectory T1 in particular shifts toward the center of the Smith chart in FIGS. 6C and 6D.

Next, when the second phase shifter 22 illustrated in FIG. 12B is added, the impedance trajectory rotates to the right, but because the center CP1 of the first trajectory T1 is already near the center of the Smith chart at this time, the second phase shifter 22 has almost no effect.

Next, when the inductor 23 illustrated in FIG. 12B is added, the center CP2 of the second trajectory T2 shifts near the center of the Smith chart.

In this manner, it is easier to carry out accurate high band matching when the phase is rotated by the second phase shifter 22 while in a state where the center CP1 of the first trajectory T1 is already near the center of the Smith chart (that is, a state of low band matching).

Figure 13:
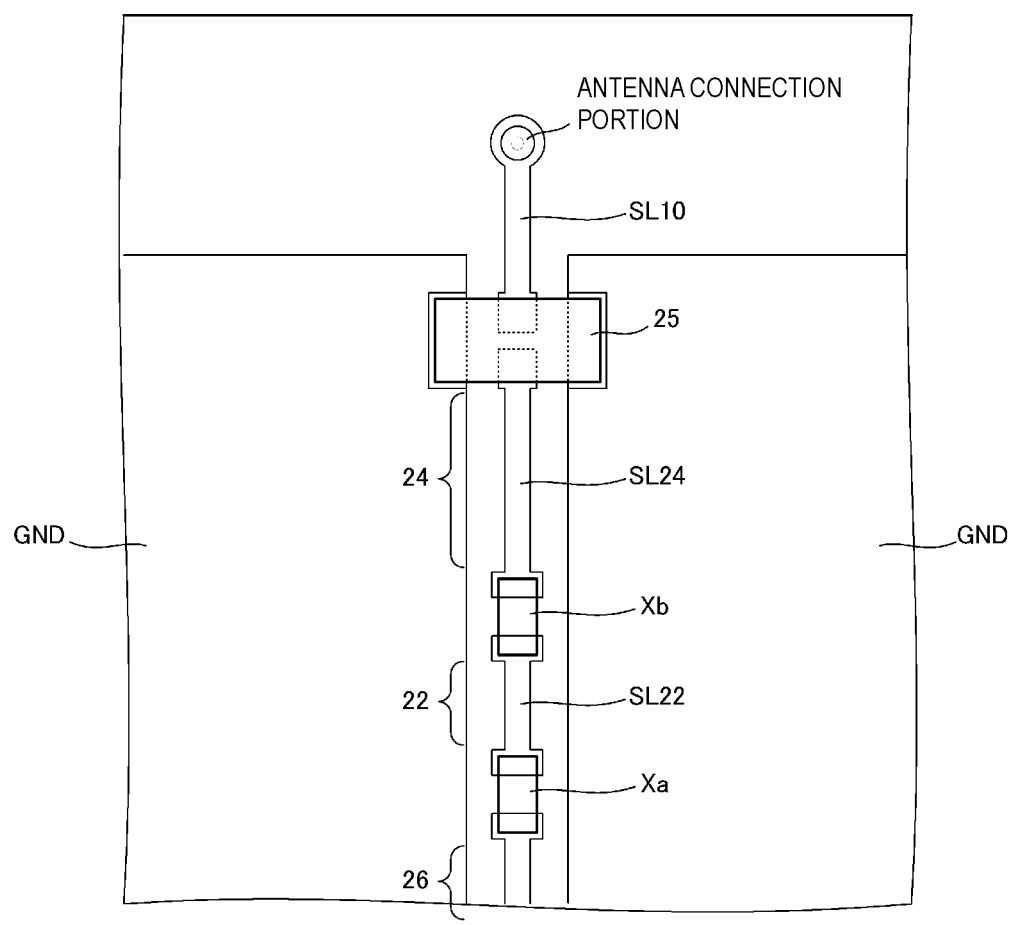
FIG. 13 is a diagram illustrating the configuration of an impedance conversion circuit, according to the second preferred embodiment of the present invention, provided on a circuit board.

FIG. 13 is a diagram illustrating the configuration of the impedance conversion circuit, according to the second preferred embodiment, provided on a circuit board. A top surface ground electrode GND, strip lines SL22 and SL24, and the like are provided on a top surface of the circuit board, and a bottom surface ground electrode is provided on a bottom surface of the circuit board. The first phase shifter 24 includes a grounded coplanar line defined by the bottom surface ground electrode, the top surface ground electrode GND, and the strip line SL24. Likewise, the second phase shifter 22 includes a grounded coplanar line defined by the bottom surface ground electrode, the top surface ground electrode GND, and the strip line SL22. Furthermore, a line 26 to which a power supply circuit is connected (a grounded coplanar line) is provided in the circuit board.

A strip line SL10 is provided on the top surface of the circuit board, between a connection portion of the auto-transformer circuit 25 and an antenna connection portion. A microstrip line is defined by the strip line SL10 and the ground electrode on the bottom surface. The antenna connection portion is a pin terminal, for example, and makes contact with the antenna element at a predetermined position.

A pattern (lands) on which the auto-transformer circuit 25 and chip components Xa and Xb are mounted is provided on the top surface of the circuit board. The auto-transformer circuit 25 preferably is a four-terminal chip component, with the third port (ground port) P3 illustrated in FIG. 9 connected to the ground electrode GND on the circuit board, the first port P1 connected to the strip line SL24, and the second port P2 connected to the strip line SL10.

In the case where the impedance conversion circuit 102A illustrated in FIG. 12A is provided, the chip component Xa is a chip capacitor (21) and the chip component Xb is a chip inductor (23). In the case where the impedance conversion circuit 102B illustrated in FIG. 12B is provided, the chip component Xa is a chip inductor (23) and the chip component Xb is a chip capacitor (21).

As described in the foregoing preferred embodiments, by using the auto-transformer circuit 25, a length of approximately 10 mm or less is sufficient for the transmission line, and with such a length, the auto-transformer circuit 25 is able to be provided or formed even on a board used in an actual cellular phone. Furthermore, a transmission line having a characteristic impedance of 50Ω, for example, is able to define and function as a matching component, and thus the number of components, the area of the board, and so on are reduced.

Other Preferred Embodiments

In addition to the preferred embodiments described above, various other configurations may be provided for the impedance conversion circuit. For example, although the above preferred embodiments describe an example in which the phase shifter includes a transmission line, the phase shifter may include a delay line.

Various other definitions of the center of the trajectory in the low band (the first trajectory) and the center of the trajectory in the high band (the second trajectory) may be included in addition to the definitions given above. For example, of an impedance trajectory obtained by sweeping across a given frequency range, an average of the reflection coefficients at each of frequencies determined at equal frequency intervals in a predetermined frequency range may be used as a center point (representative point) of the impedance trajectory in that frequency range. In the low band, the average of the reflection coefficients at each of frequencies located at equal frequency intervals for the first trajectory is the center point (representative point) of the first trajectory, and in the high band, the average of the reflection coefficients at each of frequencies located at equal frequency intervals for the second trajectory is the center point (representative point) of the second trajectory.

Meanwhile, a median point, or a gravity center of the first trajectory T1 may be defined as the center of the first trajectory, and a median point, or a gravity center of the second trajectory T2 may be defined as the center of the second trajectory.

In addition, a distance from each point in the first trajectory T1 to a given point (a coordinate distance) may be determined, and the position of a point where the sum of those distances is minimum may be defined as the center of the impedance trajectory.

Figure 20:
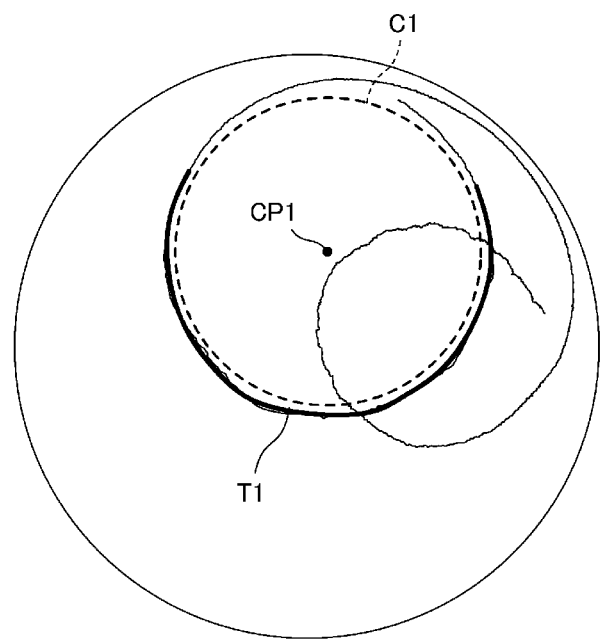
FIG. 20 is a diagram illustrating an example of the definition of the center of an impedance trajectory.

In addition, for example, the center CP1 of a circle C1 traced by the circular arc-shaped trajectory T1 may be defined as the center of the trajectory T1, as illustrated in FIG. 20.

In addition, when a trajectory in a predetermined frequency range such as the low band, the high band, or the like is in a range that makes at least one pass around a circle (a ring), the center of that circle may be defined as the center of the trajectory.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An impedance conversion circuit comprising:
   an auto-transformer circuit including a first inductor connected between a first port connected on a power supply side and a second port connected on an antenna side and a second inductor connected between a third port that is grounded and the second port, the first inductor and the second inductor being coupled to each other;
   a first phase shifter including a first end connected to the first port of the auto-transformer circuit;
   an inductor connected in series between a second end of the first phase shifter and the power supply; and
   a capacitor connected in series to the inductor and connected in series between the second end of the first phase shifter and the power supply; wherein
   the first inductor is directly connected in series between the first port and the second port.

2. The impedance conversion circuit according to claim 1, wherein
   when a region in polar coordinates where a real part is positive and an imaginary part is positive of a reflection coefficient defines and serves as a first quadrant, a region in the polar coordinates where the real part is negative and the imaginary part is positive of the reflection coefficient defines and serves as a second quadrant, a region in the polar coordinates where the real part is negative and the imaginary part is negative of the reflection coefficient defines and serves as a third quadrant, and a region in the polar coordinates where the real part is positive and the imaginary part is negative of the reflection coefficient defines and serves as a fourth quadrant,
   among trajectories of the reflection coefficient when viewing the second port side from the first port obtained by making a frequency sweep, the auto-transformer circuit shifts a center of a first trajectory that is a trajectory in a low band to the first quadrant or the second quadrant and shifts a center of a second trajectory that is a trajectory in a high band to the first quadrant or the fourth quadrant;
   the first phase shifter rotates the first trajectory so that a center thereof is in the first quadrant and rotates the second trajectory so that a center thereof is in the fourth quadrant;
   the capacitor moves the center of the first trajectory toward a center of the polar coordinates; and
   the inductor moves the center of the second trajectory toward the center of the polar coordinates.

3. The impedance conversion circuit according to claim 2, wherein the center of the first trajectory is a position in the polar coordinates that takes an average of a maximum value and a minimum value of the real part of the reflection coefficient as the real part and an average of the maximum value and the minimum value of the imaginary part as the imaginary part for the first trajectory, and the center of the second trajectory is a position in the polar coordinates that takes an average of a maximum value and a minimum value of the real part of the reflection coefficient as the real part and an average of the maximum value and the minimum value of the imaginary part as the imaginary part for the second trajectory.

4. The impedance conversion circuit according to claim 2, wherein the center of the first trajectory is an intermediate point in the polar coordinates between the reflection coefficient at a lower limit frequency and the reflection coefficient at an upper limit frequency in the low band, and the center of the second trajectory is an intermediate point in the polar coordinates between the reflection coefficient at a lower limit frequency and the reflection coefficient at an upper limit frequency in the high band.

5. The impedance conversion circuit according to claim 2, wherein the center of the first trajectory is a position corresponding to an average of the reflection coefficients at each of frequencies located at equal frequency intervals in the trajectory of the low band, and the center of the second trajectory is a position corresponding to an average of the reflection coefficients at each of frequencies located at equal frequency intervals in the trajectory of the high band.

6. The impedance conversion circuit according to claim 2, wherein the shifting of the first trajectory and the shifting of the second trajectory by the auto-transformer circuit are produced by an inductance arising in parallel and an inductance arising in series in an equivalent circuit of the auto-transformer circuit.

7. The impedance conversion circuit according to claim 1, further comprising a second phase shifter connected between the inductor and the capacitor.

8. The impedance conversion circuit according to claim 7, wherein the inductor is connected on the power supply side, and the capacitor is connected on the first phase shifter side.

9. The impedance conversion circuit according to claim 7, wherein the inductor is connected on the first phase shifter side, and the capacitor is connected on the power supply side.

10. The impedance conversion circuit according to claim 7, wherein the second phase shifter includes a transmission line or a delay line.

11. The impedance conversion circuit according to claim 7, wherein the second phase shifter is located in a multilayer body of the impedance conversion circuit or on a mounting board on which the impedance conversion circuit is mounted.

12. A wireless communication apparatus comprising:
    the impedance conversion circuit according to claim 1;
    an antenna connected to the second port of the auto-transformer circuit of the impedance conversion circuit; and
    a communication circuit that includes the power supply.

13. The wireless communication apparatus according to claim 12, wherein the wireless communication apparatus is a cellular phone.

14. The wireless communication apparatus according to claim 12, wherein the antenna is one of a T-branched antenna element, a monopole antenna, and an inverted-F antenna.

15. An antenna apparatus comprising:
the impedance conversion circuit according to claim 1; and
an antenna connected to the second port of the autotransformer circuit of the impedance conversion circuit.

16. The antenna apparatus according to claim 15, wherein the antenna is one of a T-branched antenna element, a monopole antenna, and an inverted-F antenna.

17. The impedance conversion circuit according to claim 1, wherein the first phase shifter includes a transmission line or a delay line.

18. The impedance conversion circuit according to claim 1, wherein the first phase shifter is located in a multilayer body of the impedance conversion circuit or on a mounting board on which the impedance conversion circuit is mounted.

\* \* \* \* \*